US005124702A

United States Patent [19]

van Ardenne

[11] Patent Number: 5,124,702

[45] Date of Patent: Jun. 23, 1992

[54] KEYBOAARD FOR A WORD TYPEWRITER

[76] Inventor: Robertus A. M. van Ardenne, Willem de Zwijgerlaan 35, 2252 VN Voorschoten, Netherlands

[21] Appl. No.: 630,414

[22] Filed: Dec. 19, 1990

Related U.S. Application Data

[63] Continuation of Ser. No. 209,696, Jun. 21, 1988, abandoned.

[30] Foreign Application Priority Data

Jun. 30, 1987 [NL] Netherlands .......................... 8701535

[51] Int. Cl.5 ............................................ H03K 17/94

[52] U.S. Cl. ........................................ 341/22; 341/26; 400/95

[58] Field of Search ..................... 341/22, 26; 400/91, 400/92, 93, 94, 95, 98, 482, 486, 489, 490, 484

[56] References Cited

U.S. PATENT DOCUMENTS

| | | | |
|---|---|---|---|
| 2,040,248 | 5/1936 | Dvorak et al. | 400/486 |
| 3,558,820 | 1/1971 | Baisch | 341/26 |
| 3,970,185 | 7/1976 | Shelton | 400/482 |
| 4,332,493 | 6/1982 | Einbinder | 400/484 |
| 4,715,736 | 12/1987 | McGunnigle | 400/486 |
| 4,737,040 | 4/1988 | Moon | 400/489 |
| 4,768,164 | 8/1988 | Dreher | 400/70 |
| 4,804,279 | 2/1989 | Berkelmans et al. | 400/482 |

FOREIGN PATENT DOCUMENTS

| | | |
|---|---|---|
| 586252 | 9/1933 | Fed. Rep. of Germany . |
| 703781 | 2/1941 | Fed. Rep. of Germany . |
| 2389491 | 3/1977 | France . |
| 2354202 | 1/1978 | France . |
| 2587815 | 3/1987 | France . |
| 8103641 | 12/1981 | World Int. Prop. O. . |

*Primary Examiner*—Donald J. Yusko
*Assistant Examiner*—Edwin C. Holloway, III

[57] ABSTRACT

A keyboard for recording and/or reproducing written information according to the principle of the so-called word typewriter is disclosed. The keyboard has a group of vowel keys in the center thereof, to the left thereof a group of initial consonant keys and to the right thereof a group of final consonant keys. The keyboard of the invention is characterized in that the group of initial consonant keys and the group of final consonant keys both contain substantially all of the consonants and that there are three columns of vowel keys with the center row of keys being hexagonally shaped and the keys in each adjacent column being pentagonally shaped.

16 Claims, 3 Drawing Sheets

KEYBOAARD FOR A WORD TYPEWRITER

This is a continuation of application Ser. No. 209,696, filed Jun. 21, 1988, now abandoned.

BACKGROUND OF THE INVENTION

The invention relates to a keyboard for recording and/or reproducing written information in a typewriter, word processor, printer, computer or in telecommunications equipment. The invention more particularly relates to such a keyboard for use with a so-called word typewriter, which keyboard has a group of vowel keys in the center, to the left thereof a group of initial consonant keys and to the right thereof a group of final consonant keys. It also has facilities for reproducing capitals of the letters and also reproducing figures and punctuation marks. All keys are connected to an electronic processing unit which, by means of code signals, arranges the information from keys struck approximately or exactly simultaneously into syllables to be recorded or to be reproduced.

Such a keyboard is known from European Patent 53,168. This prior art equipment is based on the principle that only a limited number of consonants is present both in the group of initial consonant keys and in the group of final consonant keys and that the missing consonants are formed by simultaneously depressing a particular combination of consonant keys which are in fact present. The intention of the small number of keys present was to achieve an increase in the typing speed. Despite the fact that an attempt was made to so construct the board and to construct the lettering in a manner differing from the standard typographic configuration such that the combination of two letter keys depressed at the same time which in shape or sound evoke the image of a missing letter, and is processed to form said letter, the result was that it is only possible to operate said known machine after a special training. Even after said training, operating the machine demands a continuous mental effort to think of the correct key combination for the letters which are not immediately recognizable.

Furthermore, in the prior art equipment, a so-called shift key is used which does not, as in the case of the traditional qwerty keyboard, cause the capital version of the letters to appear and, in the case of figure and symbol keys, a different symbol, but with which figures are formed by simultaneously depressing said shift key and letter keys.

In said prior art word typewriter, in order to reproduce the capital version of the letter symbols, a separate bar to be operated with the ball of the hand has to be depressed, but with the complication that said bar only operates as such if it is pressed separately and beforehand, whereas if one or more letter keys which represent initial consonants are depressed at the same time, the letter h is reproduced.

A space bar, also to be operated with the ball of the hand, is complicated to the extent that it only reproduces spaces if it is depressed in the case of letter-after-letter depression, whereas, if it is pressed at the same time as a syllable, it results in said syllable being joined to the preceding syllable; in the latter case it therefore acts in fact as a "no-space bar".

The last mentioned operation also indicates the only way in which the known machine is capable of combining a number of syllables to form a single word. This is difficult to carry out. After all, the limitation of the possibilities thereof is determined by the fact that only one group of consonants is available.

This, and also other drawbacks associated with the known machine, have resulted in a very high psychological acceptance threshold, as a result of which the commercial success of the equipment has remained very limited. In other words, however good the intentions were which lay behind the known equipment, the final result was apparently simple but in fact too complicated to find acceptance on a large scale. This is illustrated by the fact that anyone who has not been trained on said keyboard is usually not even capable of typing his own name.

THE OBJECTS OF THE INVENTION

The prime object of the present invention is therefore to provide a word typewriter which eliminates the abovementioned drawbacks and which has a much lower acceptability threshold.

More particularly, the object of the invention is to provide a keyboard which produces, in a very rapid manner, running and complete text and also data input (both for letter and figure material), the risk of incorrectly striking or confusing symbols being appreciably decreased. In striking the keys, the words or parts of words should be constructed in the simplest manner, namely in the same manner as they are written, from left to right, the principle of the word typewriter then being retained according to which all necessary keys are struck at the same time. The electronic processing unit provides for the arrangement of the data concerned.

SHORT DESCRIPTION OF THE INVENTION

In the keyboard according to the invention, the basic concept thereof is that the group of initial consonant keys and the group of final consonant keys both contain substantially all the consonants.

A complete, directly accessible alphabet is thus present on the keyboard as a minimum. This is very beneficial for the clear arrangement and it promotes the easy formation of the words without very concentrated consideration continuously being necessary.

The apparent complication and retardation of the typing speed which is the consequence of the presence of a complete or virtually complete series of consonants as initial, consonants and again as final consonants is very effectively eliminated in an embodiment which is characterized in that the keys are in some cases situated in blocks containing both rows and columns and in other cases in rows or columns which are offset by half a space with respect to the adjacent row or column respectively in one of said blocks. In this connection, use is made of a measure which has also already been used in the prior art machine, namely that the configuration, the height and the arrangement of the keys are such that two keys can easily be depressed simultaneously with one finger. According to the invention, not only can double positions easily be depressed but even triple positions.

In this connection, it should be pointed out that in the machine disclosed in the above discussed European Patent 53,168, it was possible to form consonants which did not have their own key with double positions—also termed slit positions in said patent. In contrast thereto, double and even triple positions mean in the case of the machine according to the invention that the two or three keys depressed at the same time are also incorporated at the same time in code and processed to form the word.

The facilities for making use of double and triple positions are increased by a functional layout according to language. This is understood to mean, inter alia, that the position of the various letters on the various keys (the layout) is chosen on the principle that letters which frequently occur in consecutive positions in the language are to be found on the keyboard in positions which are adjacent to each other. It is therefore precisely those frequently occurring letter combinations which can be struck with double or triple positions. The layout is therefore obviously dependent on the language. There are, for example, appreciable differences in the frequency and position of occurrence of the letters in the Dutch language, on the one hand, and, for example, English, on the other hand.

Starting from the fact that also in the prior art word typewriter mentioned, the group of consonant keys consists of three essentially vertical columns, the idea of placing adjacent keys in a manner such that double or triple positions can easily be formed can be implemented so that the keys in the center column are offset by half a space with respect to those in the outer columns.

According to a further preference, this is then developed so that the vowel keys in the center column are hexagonal and are inserted between the keys of the outer columns which are matchingly shaped at the adjacent side.

In this manner all the double and triple positions which occur can be produced quite easily with two or three vowels respectively.

Apart from this, the keyboard is then preferably constructed so that the vowel keys in the outer columns each form part of a row in a block of keys otherwise containing consonants.

By placing the consonant keys in rows and columns, the keys having a usual rectangular or square base area, the maximum number of double consonant positions becomes possible, namely by simultaneously depressing keys situated both above each other and next to each other.

It is, however, of importance that said bottom rows—intended to be operated with the thumb—of consonant keys are offset by half a space with respect to the rows of the blocks of consonant keys situated above them.

The consonants which most frequently occur in the language immediately before or immediately after a vowel or a pair of vowels can then be fitted in said bottom row.

As a further difference with respect to the prior art word typewriter, the invention proposes that a doubling key is arranged beneath the group of vowel keys.

On the basis of the fact that even in the prior art word typewriter, as stated above, a space bar is already present at the bottom, the latter is so constructed in the case of the keyboard according to the invention that the length of the space bar is chosen so that it extends from the first initial consonant in the bottom row to the last final consonant in the bottom row.

This makes it possible to achieve the result that the space bar can be depressed by one of the thumbs at the same time as a word or last part of a word, formed in one stroke, in order to produce a space. In this manner, the situation is avoided that a separate movement is required after each word for the space following each word.

Facilities which boost the ultimate typing speed are that the block of initial consonants also contains keys for combinations of initial consonants and that the block of final consonant keys also contains keys for syllabic endings consisting of several letters. Frequently occurring combinations of initial consonants and frequently occurring combinations which occur as the ending of a syllable are different in each language, but there is the option for each language of providing, for example, 10 to 12 of said frequently occurring combinations with their own key.

Whereas in the prior art equipment, the figures are obtained by operating the shift key, in the case of the invention a separate series of figure keys is present which is preferably positioned as a row above the letter keys. Separate symbol keys are likewise provided for.

In the keyboard according to the invention, one or more shift keys may be present, but these then serve to form the capitals of the letters and to form the less usual symbols. The same function is then actually retained again for the word typewriter as in the case of the traditional qwerty keyboards.

Attention is drawn to the fact that the concept of "syllable" may have different meanings for different languages. For example, the English word "NONE" is considered as one syllable because it represents one sound, while the same word will be interpreted, according to Dutch rules, as consisting of two syllables, "NO" and "NE".

Something similar applies to the concept of "all the consonants". Because X does not occur in English as an initial consonant, it does not need to occur in the group of initial consonants in an English keyboard either. Apart from this, within the scope of the inventive idea, there is always the option of not assigning one or more little used letters their own key either in the case of the initial consonants or in the case of the final consonants but of causing it to be generated by a double position of other keys. The expression "substantially all the consonants", as used in the claims, should therefore be interpreted in this sense.

The invention will be explained below with reference to the accompanying drawings.

SHORT DESCRIPTION OF THE FIGURES

Figure 4:
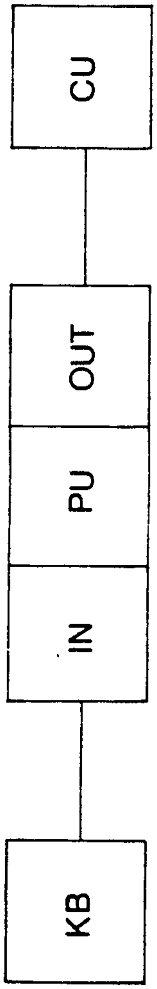

FIG. 4 a block diagram of the connection of the keyboard to the electronic processing unit and subsequently to the external processing unit.

DESCRIPTION OF THE PREFERRED EMBODIMENT

Figure 1:
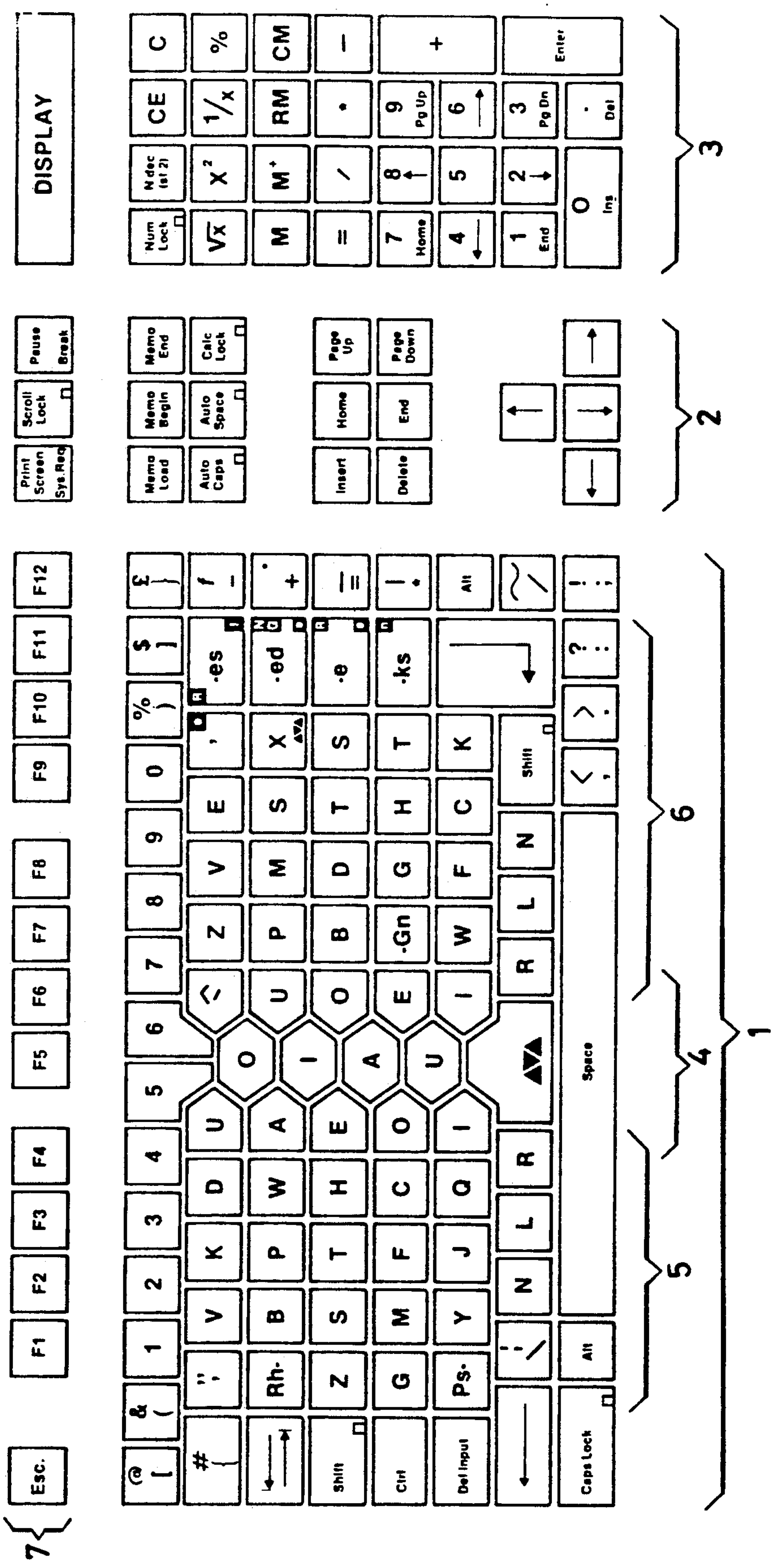
FIG. 1 shows a keyboard with a layout which is ideal for the English language.

In the embodiment of the keyboard shown in FIG. 1, the section to which the invention relates is indicated in its entirety by 1. Next to it is situated, in a manner known per se, a section containing the cursor and screen control keys, indicated by 2, and a numerical section 3. , The section 1 comprises in the center a block 4 containing vowel keys, to the left thereof a block 5 containing consonant keys which function as initial consonants, and to the right of the vowel block, a block 6 containing consonant keys which serve as final consonant keys. At the top there is a row, indicated by 7, of function keys in one row which, also in a manner known per se, stands apart from the other keys in sections 1 and 2.

In the case of a keyboard which is provided with an input section 1 according to the invention, not only can consecutive separate letters be struck, but also several syllables, and even a complete word consisting of several syllables can be struck with one stroke. Such a polyphonemic input is carried out with both hands; in principle, all the fingers participate in this stroke process. The principle of forming syllables and words from the information relating to the letters struck separately is based on the following main types of syllables or combinations thereof:

1. Only one vowel, for example "I" (in, for example, Ideal);
2. initial consonant(s)+vowel(s), for example, "NO";
3. vowel(s)+final consonant(s), for example "ON";
4. initial consonant(s)+vowel(s)+final consonant(s), for example "NON";
5. vowel(s)+initial consonant(s)+vowel(s), for example "OPEra";
6. initial consonant(s)+vowel(s)+final consonant(s)+vowel(s), for example "NONE";
7. initial consonant(s)+vowel(s)+final consonant(s)+vowel(s)+final consonant(s), for example "THUNDER";
8. initial consonant(s)+vowel(s)+final consonant(s)+vowel(s)+final consonant(s)+vowel(s), for example "SEVERE"

The types 1 up to and including 4 mentioned were also possible in the case of the known keyboard.

It is evident that only the consonant X is missing in the block 5 for the initial consonants for the English version in FIG. 1 and that the letter Q is missing in the block 6 for the final consonants; in the English language, those letters do not occur as initial or as final consonants respectively. Apart from that, both block 5 and block 6 contain all the consonants.

In both blocks of consonants, the keys are situated horizontally adjacent to each other, as a result of which rows are produced. Most of the keys in said blocks are also situated vertically above each other, as a result of which columns are produced. In addition, as a result of a suitable shape and height of the keys, two keys situated next to each other or two keys situated above each other can consequently easily be depressed (double positions). The point is that words are reproduced as much as possible by simultaneously depressing keys. These possibilities are appreciably increased by the double positions mentioned. Triple positions are also possible, inter alia, because the bottom row of consonants, containing the consonants N, L and R in block 5 and the same letters in a different sequence in block 6, are offset by half a space with respect to the row above them. The W, the R and the A, for example, can therefore easily be depressed (in the Dutch board in FIG. 2).

The number of possibilities of double and triple positions and the ease of striking them are increased further in the block 4 for the vowels. Three columns can be distinguished in this vowel block 4. The keys in the center column are offset by half a key height with respect to those in the left-hand and the right-hand column and, in addition, they have a hexagonal base area, with horizontal top and bottom edges and with points which point to the left or to the right. The vowel keys in the left-hand column are of pentagonal construction, with the point pointing to the right, and those in the right-hand column are pentagonal with the point pointing to the left. In this manner, the vowel keys in the central column are inserted between two vowel keys in the left-hand column and in the right-hand column, while conversely, most of the keys in the right-hand and in the left-hand column are inserted between the keys in the center column.

In this way, with only a slight movement of the finger, it is possible to depress only the U at the top in the left-hand column, only the A which is situated underneath it, or only the O in the center column situated next to these two keys, but the U and O can also be depressed simultaneously, the A and O can be depressed simultaneously, but, in addition, all three letters can be depressed simultaneously. Furthermore, it is evident that the vowel block 4 contains a total of thirteen vowel keys, as a result of which the letter A and the letter E can each be included twice and the other vowels can each be included three times. As a result of this, striking vowels in the correct sequence within a syllable or word is very much facilitated. Each vowel key in the left-hand column is situated in a row of keys in the initial consonant block, and equally, each vowel key in the right-hand column is situated in a row in the final consonant block. This facilitates the formation of double positions of an initial consonant and a vowel, and also of a vowel with a final consonant.

Right at the bottom of the center column of the vowel block 4 there is situated a key indicated by an AVA symbol, which is a doubling key. If this is combined in one stroke with a single vowel key, the result is a doubling of said vowel. Here, however, there is the possibility of solving specific problems in a language. Because the combination ii does not occur in the modern western languages, the Y can be formed on pressing the I with the doubling key for the English language, but, for example, the IJ for the Dutch language. Furthermore, it is of advantage if depressing the AVA key and the triple vowel combination IUO results in YOU in the English version. In the Dutch version, for example, combination of the AVA key with the combination IE, EU, AU and IO respectively can be used to produce the vowel group IEUW, EEUW, AUW or OOI.

The block 5 containing the initial consonants contains two keys with consonant combinations, namely Rh- and Ps-. On the right of the separate final consonants in the block 6 some keys of the separate final consonants in the block 6 and keys with the syllabic endings -es, -ed, -e and -ks are likewise also encountered, while the block 6 also incorporates a special key for the combination Gn which occurs in the English language.

Furthermore, the word forming possibilities can be increased still further by having some double positions form completely different letter combinations from those on the separate keys. The ending keys -es and -ed are used for forming -ing, as stated in small letters on said keys, and the ending -er is obtained with the apostrophe key and the -es key.

With the partitioning of the keyboard according to the invention there is room for a separate key for an unsounded E. It is to be found in the final consonant block 6, in the top row.

In the English layout in FIG. 1, the letter X accompanied by the doubling symbol is to be found in the second row of the final consonant group 6. Making use of the fact that the letter X as a rule never occurs in double form in the modern western languages, the equipment can be constructed so that a doubling of said final consonant key, for example buZZ, can be carried out by combining striking of this key with some other final consonant keys.

There are still specific possibilities which, because a patent application does not need to be a complete user instruction manual, will not all be enumerated at this point. However, they always involve facilities for increasing the typing speed for experienced users; knowledge of those facilities is not necessary to be able to operate the keyboard. The acceptance threshold is therefore not increased as a result of this.

The figures are incorporated on separate keys which extend as a row along the top of the three blocks 4, 5 and 6. The shift keys—for convenience of operation two are present in different positions—therefore serve exclusively for switching the lower case and capital forms of the letters and for switching the various symbols which are provided in twos on one key. As regards these symbol keys, attention is drawn to the fact that the most used symbols are in each case in the position in which the shift key does not have to be depressed. The shift keys are so positioned that all the symbol keys which also have a symbol in the shift position can be depressed together with a shift key at one go using one hand. If a shift key is depressed beforehand, this results in a hold function with the subsequent letter being reproduced in capital form, and this is indicated in that a small lamp (LED) in the shift key lights up in the meantime.

In the bottom row a space bar is present. This runs from the letter N in block 5 to the N in block 6. As a result of this, the letters N, L and R in block 5 or R, L and N in block 6 can always be depressed with the thumb simultaneously with the space bar.

The reason for this is that the three letters mentioned; N, L and R; mostly occur both in English and Dutch just before or just after a vowel when these letters occur together with other consonants. Both in the block of initial consonants and in the block of final consonants, they are at a position in which they will be depressed with the thumb. It then requires no additional effort to depress the space bar with the same thumb in the same movement. As a result of that simultaneous depression of the space bar, a separate operation for causing the space to be produced at the end of the word formed is avoided.

Both in block 5 and in block 6, the keys for the letters N, L and R are placed half a key space inwards with respect to the rows situated above them in the same blocks. As a result of this they end up nearer each other, but above all, these six keys are then easier to reach with a thumb movement. In the meantime, the doubling key situated in between in line with the center column of the vowel group 4 remains of sufficient width for it to be readily capable of being involved in a double or triple position with the adjacent keys both at the left-hand and at the right-hand side.

In view of the occurrance of the letters N, L and R immediately before and after the vowels, they are also as a rule placed last in the group of initial consonants and first in the group of final consonants for sorting the key codes, which will be described in more detail.

The punctuation marks, . : ; are advantageously provided at the end of the group of final consonants on keys adjacent to each other. They are then logically and easily accessible. In the version shown, the positioning chosen therefore is in line with the space bar.

In contrast with the known equipment, the keyboard is completed by a backspace key, a tabulator key and a Ctrl (Control) key and such keys. Attention is also drawn to the DEL INPUT key which can be depressed in order to delete a number of strokes.

Figure 2:
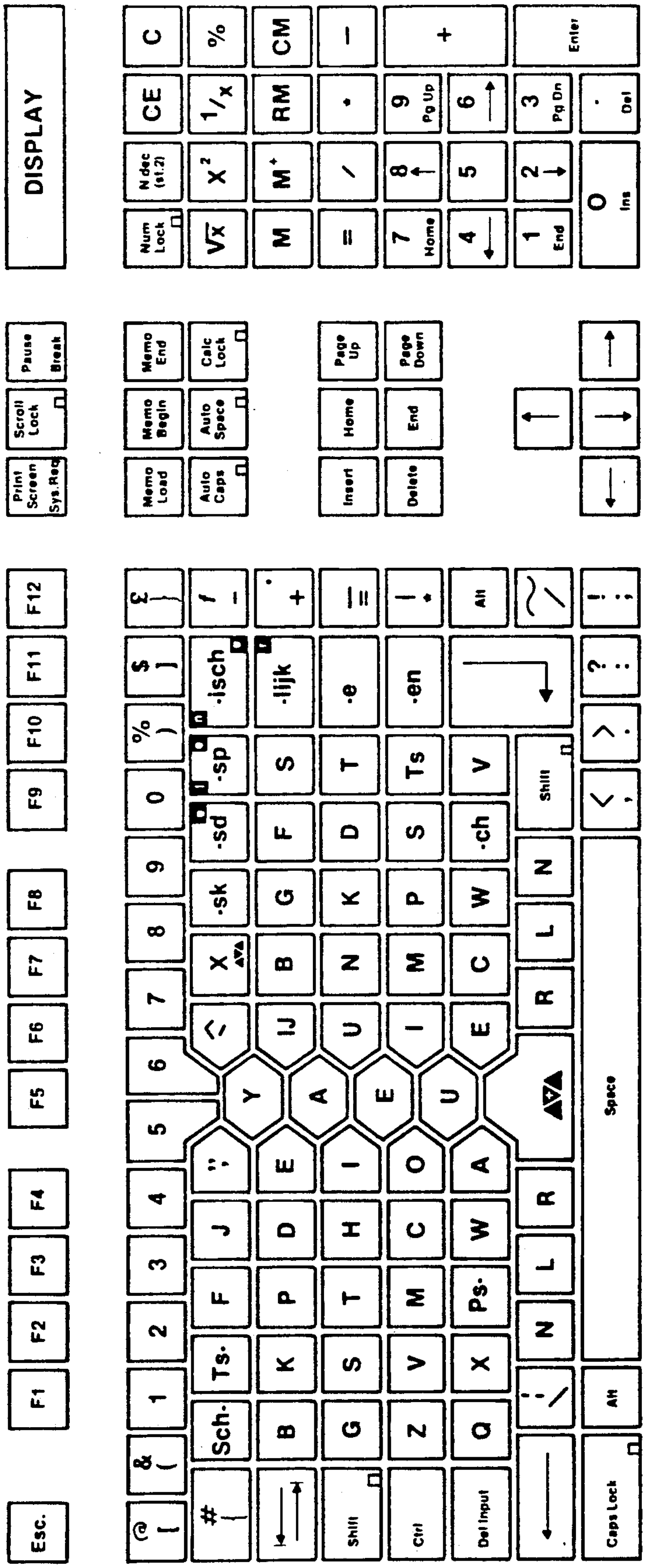
FIG. 2 shows the keyboard in a construction which is ideal for the Dutch language.

The layout shown in FIG. 2, which is ideal for the Dutch language, is based on the same principles as the English version. A different positioning of the letters on the keys is noticed, and obviously also different consonant combinations in the initial consonants and different ending combinations in the case of the final consonant keys. The positioning of the letters has been optimized in both cases on the basis of an analysis of, on the one hand, the English language and, on the other hand, the Dutch language, but it remains possible, of course, also to work in any other language with a keyboard which is ideal for the one language.

As regards the optimization, the versions shown in FIGS. 1 and 2 are based on the same principle which can also be used for all other languages. Apart from the letters N, L and R, which occupy a special place in the word formation in both languages, both the initial consonant group 5 and the final consonant group 6 contain five rows. On the basis of an analysis which has been carried out of the occurrence of letters and letter combinations in, each language, the third row (that is to say the center row) is as a principle used for the letter which occur most frequently, the rows 2 and 4 for the letters which are used somewhat less frequently, and the rows 1 and 5 for the letters which occur least frequently. This occasions the greatest convenience and the highest working speed if a large number of keys are struck at the same time according to the principle of the word typewriter.

Figure 3:
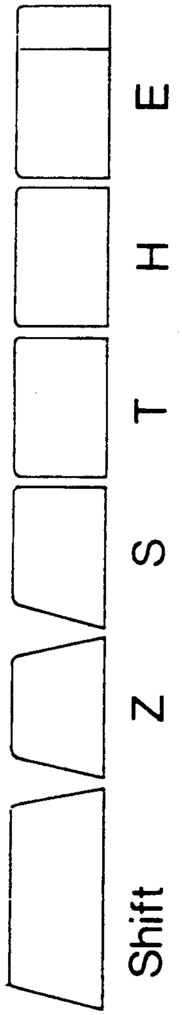
FIG. 3 shows diagrammatically the shape of a few adjacent keys.

In view of the formation of multiple positions, the invention also furthermore provides a special shape for the keys. For this purpose, reference is made to FIG. 3 which is intended as a view in the direction of the center row of initial consonant keys in the English board in FIG. 1. It is evident that the keys have in some cases vertical side faces and in other cases sloping side faces. The keys for the H and the E are both straight on the sides facing each other. The distance between the keys near the top face is thus minimal and it is therefore easy to form a double position by depressing the H and the E. The same applies to the T and the H, and again to the S and the T, since those letter combinations both occur. Because, however, the letter combination ZS does not occur in the English language, a double position on those two keys not only serves no purpose, but it could even give rise to an error. In order to reduce the number of incorrect strokes in the form of double positions, it is evident that the Z key and the S key both have slopes on the faces which face each other. As a result of this, the distance between the top faces is large and it is virtually impossible to form a double position with those keys. The same again applies therefore to the faces of Z key and the shift key which face each other because the last mentioned is of course never struck in a double position with an adjacent letter. The same principle of vertical construction of adjacent keys in the case of a possible double position, and a sloping face in the case where a double position must be ruled out, can be applied in the case of keys which are adjacent to each other in the columns (for example, the W and H).

This idea of chamfering a key which must not be struck may, furthermore, be used (not shown) where, for example, at the bottom of the Dutch board, the W and the R can be struck as a double position. Because, however, the R is in the row which is offset by half a key space, the danger could consequently arise that the L situated next to the R is also depressed. Such a triple position is meaningless in the Dutch language, and in order to avoid this, not only are the side faces of the L facing the W and the R of sloping construction, but the right-hand top corner thereof is also additionally chamfered.

In relation to the construction and the operation of the electronic processing unit, it should first of all be remembered that, in the case of the equipment known from European Patent 53,168, a code is indeed initially assigned to each key, but the coding device is so constructed that if the codes of two consonant keys are present at the same time, a new code is generated which corresponds to a consonant without its own key. In the case of the invention, on the other hand, all the consonants are already present in the initial consonant block 5 and in the final consonant block 6. In order to be able to deliver complete running text, it is therefore sufficient if the device for generating the codes is so constructed that each key produces its own specific code. In each case, whenever there is a change with respect to the zero position, this will lead to a series of one or more codes (code string). The electronic processing unit is, furthermore, so constructed that, for each stroke, the codes of all the keys depressed simultaneously in that stroke are taken stock of and then placed in order. In the ordering, the principle is adhered to that the codes are positioned behind each other first for each column from top to bottom and then for each row from left to right, with the N, L and R—in this sequence—as the last of the initial consonants and R, L and N as the first of the final consonants. In that situation, the codes form the string of characters which is fed to the printing equipment or computer unit.

In relation to the keys on which a combination of letters occurs, there is therefore the choice of assigning such a letter combination key either a separate code or a code which is made up of the codes associated with the separate letters.

A few more facilities are associated with this outline of the structure. Thus, the occurrence in the code string of the codes of the doubling keys and of a vowel key will result in the calling of a combination routine (CR), on the basis of which a doubling of said vowel occurs. As stated, there is also the possibility in a few positions of forming a different letter combination, such as the English ending -ING by means of a double position as a result of simultaneously depressing the keys -es and -ed. If the codes of those two keys occur together, the result is also the calling of the combination routine which provides for these codes to be replaced by the code(s) for the letter combination -ING in the final character string.

FIG. 4 shows a simple block diagram of the manner in which the electronic processing unit in the keyboard is connected to an external processing unit (printing unit, computer, etc.).

The keyboard KB is connected to the processing unit PU via an input circuit IN. With the aid of the input circuit, the PU determines the status of each of the keys, only two states being possible for each key, viz. struck or not struck. On the basis of the code string which is consequently made available to the PU and the CR provided to the PU, the letter or character string thus obtained is then fed out via the output circuit OUT to the printing unit or computer unit CU. For this purpose, the PU is connected via the IN and OUT to the keyboard and the CU.

The PU scans the keyboard at regular time intervals, information being received on the state of the keys and this information representing an ordered set of characters. At the instant all the keys are released again after a group of keys has been struck, the zero status is detected and this signals the NEW status. A memory field indicates which code series has been typed in since the last NEW signal. After the NEW status has been reached, the code string is placed in a cyclic buffer CBUF, which CBUF can contain a number of said code strings. The contents of the CBUF are converted by means of the CR into a character string which is placed in a different memory and is ready for transmitting to a CU. The above procedures are repeated ten to thirty times per second and result in a minimum of 2 to 3 key scans per stroke.

Correction of characters which have already been transmitted to a CU is possible at two levels, viz. erasure of the last character by means of the backspace key (←) and erasure of the whole of the last stroke by means of the DEL INPUT key.

The combination shown in FIGS. 1 and 2 of a text input block, a cursor and screen-control block and a numerical block is achieved by adding a multipurpose key pad and extending the numerical pad with twelve keys including an ENTER key, and a liquid crystal display situated in the top right-hand corner.

The multipurpose key pad contains three memo keys which serve to assign sections of text to other keys. These stored key strokes can be copied at any desired instant from a memory starting from a position indicated by the cursor.

The procedure is as follows: press MEMO LOAD, give the section of text which is to be stored a name by depressing one of the function keys (for example, F4), press MEMO BEGIN and type in the text to be stored. Terminate the load procedure by depressing MEMO END. The text can now be reproduced starting from any desired position by depressing MEMO LOAD and MEMO BEGIN together followed by the name of the section of text (in the example, F4).

The stored key strokes can be erased by repeating the load operation in accordance with the above, with the proviso that MEMO BEGIN and MEMO END now have to be depressed together after typing the name.

The multipurpose pad also contains three on/off function keys, viz. AUTO CAPS, AUTO SPACE and CALC LOCK, in which case, if AUTO CAPS is switched on, the use of the punctuation signs . and ? and ! in the text input block will result in the setting of a capital letter for the next stroke without the shift key having to be used at the same time. In the switched-on state, AUTO SPACE ensures that after every punctuation mark and close bracket, the associated space is automatically obtained and also that the punctuation marks, the oblique stroke, close bracket and close quotation mark follow the preceding letter (combination)s without a space. Apart from this, with AUTO SPACE and CAPS LOCK switched on, every space preceding the use of punctuation marks, close bracket and close quotation mark will automatically be erased.

The last key of the multipurpose block is the CALC LOCK key. If this function is switched on, all the keys with the exception of all the keys of the numerical block are disabled in order to be able in this way to carry out "off-line" calculations. The numerical block then behaves as a calculator, the results of the calculation not appearing immediately on the screen but on the display of the keyboard. The accuracy of the results can be adjusted with the aid of N DEC key, in which case the standard two decimal places are employed. By switching off the CALC function again, the result can be fed out of the display to the CU by depressing the ENTER key.

What is claimed is:

1. A keyboard for a word typewriter, the keyboard having a group of vowel keys in the center consisting of three columns, a group of initial consonant keys to the left of the vowel group and a group a final consonant keys to the right of the vowel group, and wherein the keys of the keyboard are distributed over at least five rows, the distribution of the keys being in accordance with the principle that the keys in the third row contain the letters which occur most frequently as letters and letter combinations in the language in which the keyboard is utilized, the second and the fourth rows contain the letters which occur less frequently as letters and letter combinations in the language in which the keyboard is utilized, and the first and fifth rows contain letters which occur least frequently as letters and letter combinations in the language in which the keyboard is utilized.

2. The keyboard of claim 1 further comprising a space bar at the bottom of the keyboard and a doubling key situated beneath the group of vowel keys and wherein the keys of the consonants which, when the consonants occur with vowels in the words of the language of the keyboard, most frequently occur just before or just after the vowels, are located in a separate row of keys above the space bar, the row containing the doubling key and the row being offset from the row of keys above by one-half key.

3. Keyboard for recording and/or reproducing written information in a typewriter, word processor, printer, computer or in telecommunications equipment, the keyboard having a group of vowel keys in the center consisting of three columns, having to the left of the vowel group a group of initial consonant keys and to the right of the vowel group a group a final consonant keys, the vowel keys in the outer columns of the vowel group each forming part of a row in an adjacent block of keys otherwise containing consonants, all the keys being connected to an electronic processing unit which, by means of code signals generated by means which assigns a specific code to each key, arranges the information from keys touched approximately or exactly simultaneously into syllables to be recorded or to be reproduced, wherein the group of initial consonant keys contains separate keys providing for substantially all the consonants which normally occur as initial consonants in the words of the language of the keyboard, each separate key independently providing a different initial consonant, and wherein the group of final consonant keys contains separate keys providing for substantially all the consonants which normally occur as final consonants in the words of the language of the keyboard, each separate key independently providing a different final consonant, and in that the vowel keys in the center column are hexagonal and are inserted between pentagonal keys of the outer columns of the vowel group, the sides of the hexagonal keys being matchingly shaped with the adjacent sides of the pentagonal keys of the outer columns, and wherein at least some of the keys corresponding to letters which occur most frequently together in the words of the language of the keyboard are adjacent to each other and have straight adjacent vertical sides, and wherein at least some of the keys corresponding to letters which occur least frequently together in the words of the language of the keyboard are adjacent to each other and have sloping adjacent vertical sides.

4. The keyboard of claim 3 wherein a space bar is provided at the bottom of the keyboard, the space bar having processing means such that a space is introduced between words where necessary, the space bar extending from the first initial consonant in the bottom row to the last final consonant in the bottom row.

5. The keyboard of claim 3 wherein the group of initial consonant keys contains single keys providing for combinations of initial consonants.

6. The keyboard of claim 3 wherein the group of final consonant keys contains single keys providing for combinations of final consonants or word endings.

7. The keyboard of claim 3 further comprising a selection key for activation and deactivation of the upper case form of the letters represented by the keys, the selection key having processing means such that the selection key functions, in its activated state, to automatically generate the upper case form of the letter where the letter occurs after a punctuation mark which ends a sentence.

8. The keyboard of claim 3 further comprising a space selection key for activation and deactivation of the space setting, the space selection key having processing means such that the space selection key functions, in its activated state, to automatically insert spaces after a punctuation mark which ends a sentence.

9. The keyboard of claim 3 wherein the punctuation symbols , . ; : ? ! are located as a group on keys adjacent to each other and the punctuation group is positioned at the end of the final consonant group.

10. The keyboard of claim 3 further comprising a section containing cursor and screen-control keys, a numerical section having an ENTER key, and a number of keys for combining the text input section and the numerical section.

11. The keyboard of claim 3 wherein means are provided which assigns a specific code to each key and means are also provided which arranges a code string of the specific codes when the keys having the specific codes are touched either individually or substantially simultaneously.

12. The keyboard of claim 3 wherein the keys of the keyboard are distributed over at least five rows, the distribution of the keys being in accordance with the principle that the keys in the third row contain the letters which occur most frequently in the language in which the keyboard is utilized, the second and the fourth rows contain the less frequently occurring letters, and the first and fifth rows contain letters which occur least frequently.

13. The keyboard of claim 12 further comprising a space bar at the bottom of the keyboard and a doubling key situated beneath the group of vowel keys and wherein the keys of the consonants which, when the consonants occur with vowels in the words of the language of the keyboard, most frequently occur just before or just after the vowels, are located in a separate row of keys above the space bar, the row containing the doubling key and the row being offset from the row of keys above by one-half key.

14. The keyboard of claim 3 wherein a doubling key is situated either beneath the group of vowel keys or in one of the consonant groups.

15. The keyboard of claim 14 wherein means are provided which assigns a specific code to each key and means are also provided which arranges a code string of the specific codes when the keys having the specific codes are touched either individually or substantially simultaneously.

16. The keyboard of claim 15 wherein, if the specific code associated with the doubling key is present in a code string, the means provided to arrange a code string doubles the specific code for the vowel present in the code string, and if more than one vowel is present in the code string, said means provided to arrange a code string generates the codes for a predetermined letter combination different than the vowel.

* * * * *

UNITED STATES PATENT AND TRADEMARK OFFICE

CERTIFICATE OF CORRECTION

PATENT NO. : 5,124,702

DATED : June 23, 1992

INVENTOR(S) : Robertus A. M. van Ardenne

It is certified that error appears in the above-identified patent and that said Letters Patent is hereby corrected as shown below: On the title page: Item [54] and Column 1, line 1, change "KEYBOAARD" to --KEYBOARD--.

Column 2, line 47, delete ",".

Column 4, line 54, after "FIG. 4" insert --is--; line 65, delete ",".

Column 5, line 32, after " "SEVERE" ", insert --.--.

Column 6, line 50, after "and" insert --some--.

Column 8, line 29, delete "," (first instance); line 30, change "letter" to --letters--.

Column 11, line 18, change "a" (second instance) to --of--; line 48, change "a" (second instance) to --of--.

Signed and Sealed this

Fourteenth Day of September, 1993

*Attest:*

BRUCE LEHMAN

*Attesting Officer*

*Commissioner of Patents and Trademarks*